(12) United States Patent
Shien et al.

(10) Patent No.: US 6,595,075 B1
(45) Date of Patent: Jul. 22, 2003

(54) METHOD AND APPARATUS FOR TESTING CASSETTE POD DOOR

(75) Inventors: Kwen-Mu Shien, Hsin-chu (TW); Fu-Sun Lo, Hsinchu (TW); Ray-Chung Peng, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/140,401

(22) Filed: May 6, 2002

(51) Int. Cl.[7] .............................. G01L 3/00; E05F 15/00
(52) U.S. Cl. .................... 73/865.9; 206/710; 292/68; 49/31
(58) Field of Search .................... 73/862.08, 862.23, 73/862.29, 862.53, 862.193, 865.9; 250/239, 559.29, 559.3, 548, 221; 206/387.12, 400, 387.11, 387.14, 387.13, 387.1, 710; 292/4, 5, 6, 68, 57, 58, 59, 63, 66, 71, 157, 256.5, 159, 330; 414/936–939; 220/245, 251, 323; 49/31, 118, 124, 280, 334, 395, 306

(56) References Cited

U.S. PATENT DOCUMENTS

| | | | | |
|---|---|---|---|---|
| 4,891,910 A | * | 1/1990 | Cook et al. ................ | 49/395 |
| 5,915,562 A | * | 6/1999 | Nyseth et al. .............. | 206/710 |
| 5,931,512 A | * | 8/1999 | Fan et al. .................. | 292/66 |
| 5,957,292 A | * | 9/1999 | Mikkelsen et al. .......... | 206/710 |
| 6,000,732 A | * | 12/1999 | Scheler et al. ............. | 292/68 |
| 6,105,782 A | * | 8/2000 | Fujimori et al. ........... | 206/710 |
| 6,160,265 A | * | 12/2000 | Bacchi et al. ............. | 250/559.29 |
| 6,430,877 B1 | * | 8/2002 | Rosenquist et al. ........ | 49/395 |
| 6,457,598 B1 | * | 10/2002 | Hsieh et al. .............. | 220/323 |
| 6,501,070 B1 | * | 12/2002 | Bacchi et al. ............. | 250/239 |
| 6,502,869 B1 | * | 1/2003 | Rosenquist et al. ........ | 292/59 |
| 2002/0149209 A1 | * | 10/2002 | Bonora ..................... | 292/330 |

FOREIGN PATENT DOCUMENTS

DE     3514223 A1 * 10/1986     ......... H02P/7/00

* cited by examiner

*Primary Examiner*—Helen Kwok
*Assistant Examiner*—David Rogers
(74) *Attorney, Agent, or Firm*—Tung & Associates

(57) ABSTRACT

A method and an apparatus for testing the unlatching torque of a cassette pod door in order to determine whether a cassette pod door is completely unlatched by latch keys of a door opener in a loadport. When a failure of unlatching operation is indicated, the apparatus reverses the rotational direction of the DC motor and thus, turning the latch keys in an opposite direction to re-latch the cassette pod door onto the cassette pod so that the pod can be securely removed from the loadport without danger of accidental opening of the door.

17 Claims, 3 Drawing Sheets

METHOD AND APPARATUS FOR TESTING CASSETTE POD DOOR

FIELD OF THE INVENTION

The present invention generally relates to a method and an apparatus for testing the operation of a cassette pod for storing and transporting semiconductor wafers and more particularly, relates to a method and an apparatus for testing the operation of a cassette pod door or the unlatching torque of a cassette pod door during a door opening procedure.

BACKGROUND OF THE INVENTION

The high level of automation used in fabricating semiconductor devices relies on sophisticated handling and transport equipment for moving semiconductor wafers between various processing stations. Most handling and transport operations are conducted under automatic control using a programmed computer which issues control signals for operating the equipment with little or no intervention by an operator. In many systems, standard mechanical interface (SMIF) pods are used to transport batches of wafers that are stored in cassettes. These pods include a base upon which the cassettes rest, and a cover removably secured to the base and completely enclosing the cassette. The cover protectively surrounds the cassette, and thus the wafers, from the surrounding environment which may contain airborne, contamination particles. SMIF pods are most often used to transport cassettes from one clean room environment to another, where during the transport movement, the wafers, if not covered, are exposed to the contaminating environment. In more recent development, FOUPs (front open unified pod) are used for storing and transporting 12" wafers.

After a pod has reached the vicinity of a processing station within a protected, clean room environment, it is necessary to remove the cover so that automated wafer transfer robots can access the individual wafers held in the cassette. The cover is held on the pod by one of various types of latching mechanisms which is automatically actuated to latch and unlatch the cover by means of actuating controls positioned at each processing station. Thus, when a pod is transported to a processing station, control mechanisms engage the latch mechanism on the pod to unlatch the cover, following which either an operator or a robotic mechanism removes the cover to expose the cassette. After the batch of wafers in the cassette is processed, the cover is reinstalled on the pod base, either manually or robotically, and the control mechanism is again actuated to latch the cover onto the base (for SMIF) or onto the back (for FOUP) before the pod leaves the processing station.

In spite of the fact that positive latch mechanisms are designed to lock the cover on the pod base, occasions arise when, for a variety of reasons, the latch fails to lock the cover onto the pod base. This may occur, for example, when a foreign article becomes lodged between the cover and the base or when the cassette becomes tilted on the base, thus interfering with the proper seating of the cover. In other cases, the control mechanism for actuating the latch may malfunction. Frequently, such failure of the latch mechanism to lock the cover on the pod base goes undetected by process operators. As a result, it is possible that contaminants may pass through between the pod base and cover when the pod leaves the clean room environment, resulting in possible contamination of the wafers.

Accordingly, there is a clear need in the art for an improved pod construction which insures that the cover is properly locked onto the pod. The present invention is directed toward satisfying this need in the art.

FIG. 1 illustrates a cassette pod such as a FOUP that is installed on a process machine. The cassette pod 10 is positioned on a loadport 12 of the process machine 14. The loadport 12 is normally equipped with a plurality of locating pins 16 for the proper positioning of the cassette pod 10.

A detailed perspective view of the cassette pod, i.e. the FOUP 10, is shown in FIG. 4. The FOUP 10 is constructed by a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18 is provided a plate member 52 for gripping by a transport arm (not shown) of an overhead hoist transport system. It should be noted that, for simplicity reasons, the latching mechanism for opening and closing the FOUP door, or the cover portion 28, is not shown in FIG. 2.

In the conventional cover member, or door 28 of the FOUP 10, the door opening/closing mechanism is shown in FIG. 3 in a plane view. Locking tabs 20a, 20b, 22a and 22b are provided at the top and at the bottom of the cover member 28. Circular drive plates 24a and 24b are connected to the locking tabs 20a–22b by mechanical linkage 26a and 26b and operated by latch holes 28a and 28b. A pair of latch keys (not shown) that are part of the door opener mechanism of the loadport (not shown) are inserted into the latch holes 28a and 28b and turned by a DC motor to lock or unlock the cover member 28 to the loadport opening. As shown in FIG. 3, when the drive plates 24a and 24b are turned in a clockwise direction, the locking tabs 20a, 20b, 22a and 22b are withdrawn into the frame of the cover member 28 and therefore, unlocking the cover member 28 from the body member 18 of the cassette pod 10 (shown in FIG. 2). Conversely, when the drive plates 24a and 24b are turned by the DC motor in a counter-clockwise direction, the locking tabs 20a, 20b, 22a and 22b are extended out of the frame of the cover member 28 to engage receptacles (not shown) in the body member 18 and thus, locking the cover member 28 to the body member 18 of the cassette pod 10.

Problems occur when operating the conventional door opening/closing mechanism shown in FIG. 3 installed on a FOUP. For instance, the latch keys (not shown) that are turned by the DC motor sometimes are misaligned with the latch holes 28a and 28b and thus, the door opening or closing operation cannot be carried out. Secondly, the torque of the DC motor cannot always be precisely controlled such that the angle of turning, i.e. such as a 90° angle, cannot be precisely controlled. A door opening or closing mechanism can not be completely executed when the angle of rotation is not exactly 90°. For instance, during a door locking operation if the latch holes 28a and 28b are not turned to a perfect vertical position in order to lock the cover member 28 to the body member 18 and when the FOUP 10 is later positioned on another process equipment, a similar set of door opening latch keys can not be inserted into the latch holes 28a and 28b and thus, the cover member 28 cannot be opened or unlocked from the body member 18.

In the operation of cassette pods for the 300 mm diameter wafers, i.e. the FOUP, an error message is frequently observed during the unlatching of a FOUP door from the FOUP. The error message occurs when a torque required to open the FOUP door is detected to be larger than 80 in-lb. A higher than normal torque reading indicates one of many possible defective conditions of the FOUP. For instance, a distortion in the latch mechanism of the FOUP door and thus, excessively high torque is required to unlatch the door from the FOUP. Other defective conditions may include a misalignment between the latch key of the door opener in the loadport and the latch holes in the FOUP door. The misalignment may also be caused by a distorted FOUP door which occurs after extended usage.

Conventionally, a DC motor is used to unlatch the FOUP door. When a torque reading of the DC motor, during the unlatching operation, exceeds 80 in-lb, the DC motor is stopped to prevent any possible damage that may be caused in the motor. The FOUP is then manually removed from the loadport for the operator to diagnose the cause of the malfunction. The manual operation of removal can be difficult since the FOUP door may be partially unlatched and thus, accidental opening of the door may cause severe damage to the wafers stored inside.

It is therefore an object of the present invention to provide a method for unlatching a cassette pod door from a pod without the drawbacks or shortcomings of the conventional method.

It is another object of the present invention to provide a method for unlatching the cassette pod door of a pod that can be carried out without causing damage to the door or the wafers stored inside.

It is a further object of the present invention to provide a method for testing the operation of a cassette pod door that can be used as a reliability screening test for detecting defective cassette pod doors.

It is another further object of the present invention to provide a method for testing the unlatching torque of a cassette pod door for detecting doors that require excessive torque for opening.

It is still another object of the present invention to provide a method for testing the unlatching torque of a cassette pod door by first detecting an excessively high torque and then reversing a motor to re-latch the door into a secure, locked position before the pod is removed.

It is yet another object of the present invention to provide an apparatus for testing the unlatching torque of a cassette pod door that can be used as a reliability screening test.

SUMMARY OF THE INVENTION

In accordance with the present invention, a method and an apparatus for testing the unlatching torque of a cassette pod door from a cassette pod and thus, screening out defective cassette pod doors are provided.

In a preferred embodiment, a method for testing the operation of a cassette pod door can be carried out by the operating steps of providing a cassette pod that has a door latched on an opening; engaging a latch key to a latch hole on an exposed surface of the door; switching on a DC motor to turn the latch key in a first rotational direction for unlatching the door from the cassette pod; measuring a torque of the DC motor during the switching-on step; stopping the unlatching operation by switching-off the DC motor when the torque measured exceeds 80 in-lb; and switching on the DC motor to turn the latch key in a second rotational direction opposite to the first rotational direction to re-latch the door onto the cassette pod.

The method for testing the operation of a cassette pod door may further include the step of, during the second switching-on step, increasing the torque to higher than 80 in-lb to turn the latch key in the second rotational direction.

The method may further include the step of providing a cassette pod for holding 300 mm diameter wafers. The method may further include the step of increasing the torque by increasing a current input to the DC motor, or the step of providing a controller for controlling the operation of the DC motor. The method may further include the step of sending an alarm signal to an operator from the controller when a torque larger than 80 in-lb on the DC motor is detected. The method may further include the step of marking the cassette pod as defective when the torque measured exceeds 80 in-lb. The method may further include the step of detecting a position of the latch hole and determining whether the cassette pod door is completely unlatched, or the step of detecting a position of the latch hole and sending a signal to a controller to indicate that the cassette pod door is unlatched.

The present invention is further directed to an apparatus for testing the unlatching torque of a cassette pod door which includes a stage onto which a cassette pod having a door latched thereon is positioned; a door opening mechanism including latch keys on the stage; a DC motor for turning the latch keys after engaging latch holes situated in the cassette pod door in either a latching direction or an unlatching direction; and a controller for measuring a torque on the DC motor by monitoring a current input to the DC motor, the controller stops an unlatching motion of the latch keys when a torque measured is greater than 80 in-lb and causes the latch keys to turn in an opposite direction to re-latch the door on the cassette pod before the pod is removed from the apparatus.

The apparatus for testing the unlatching torque of a cassette pod door may further include an alarm for triggering by the controller when the torque of larger than 80 in-lb is detected. The apparatus may further include a position detector mounted juxtaposed to the latch hole for determining an unlatched position of the latch keys, or a position detector mounted juxtaposed to the latch hole for sending out a signal indicative of an unlatched position to the controller when the position is detected. The apparatus may further include a position detector mounted juxtaposed to the latch keys for determining an unlatched position of the latch keys, or a position detector mounted juxtaposed to the latch keys for sending out a signal indicative of an unlatched position to the controller. The controller converts an input current to the DC motor to a measurement of torque. The apparatus may further include a torque display device for displaying a torque measured by the controller.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for testing the operation of a cassette pod, or a method for testing the unlatching torque of a cassette pod that is used for holding 300 mm diameter wafers. The present invention is further directed to an apparatus for conducting such tests.

The method may be carried out by first engaging at least one latch key of a door opener in a loadport to at least one latch hole situated in the cassette pod door. A DC motor is then switched on to turn the latch key in an unlatching direction, while a torque is determined based on the input current to the DC motor by a controller. When the torque determined exceeds 80 in-lb, the unlatching operation of the cassette pod door is stopped by switching off the DC motor. The DC motor is then switched on to turn the latch key in an opposite direction, i.e. in a direction to latch the cassette pod door, such that the door is re-latched onto the cassette pod to secure the wafers stored in the pod.

The step of switching on the DC motor to turn the latch key in an opposite direction may require a larger input current to the DC motor such that an latching torque larger than 80 in-lb is used to re-latch the door. This is necessary since the cassette pod cannot be removed from the loadport with the door in a half-latched position which may cause damage to the wafers if the door accidentally opens.

When the unlatching torque measured exceeds 80 in-lb, and thus the unlatching operation is stopped, the cassette pod is marked as defective and sent for repair. An alarm may also be triggered to alert the operator that the cassette pod should not be further used for loading wafers into a process machine.

The present invention further discloses an apparatus for testing the unlatching torque of a cassette pod door which includes a cassette pod stage, a door opening mechanism in the stage, a DC motor for turning the latch keys when engaged with the cassette pod door, and a controller for determining an unlatching torque on the DC motor during the unlatching process.

Figure 1:
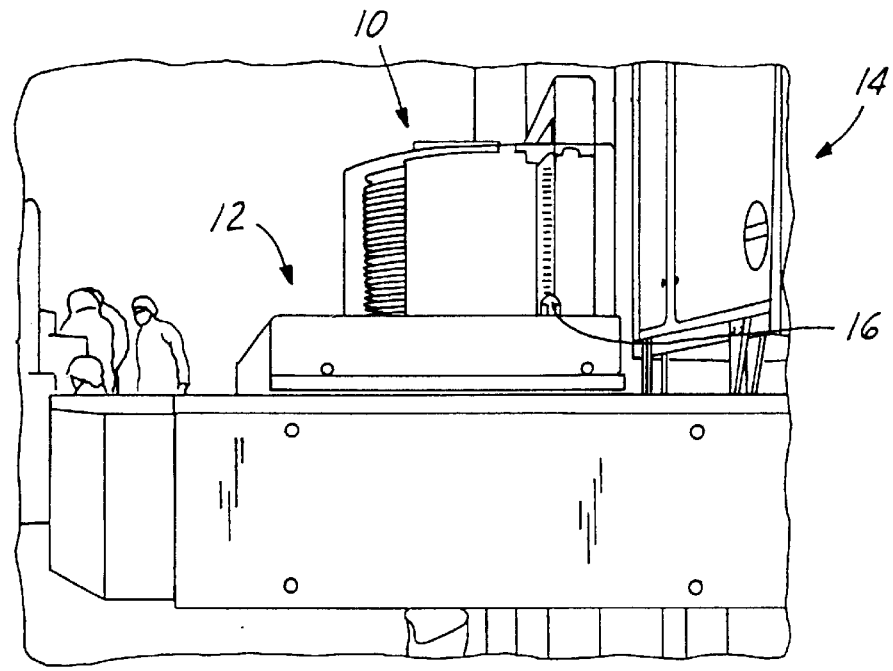
FIG. 1 is a perspective view of a cassette pod for 300 mm wafers positioned on a loadport of a process machine.
Figure 2:
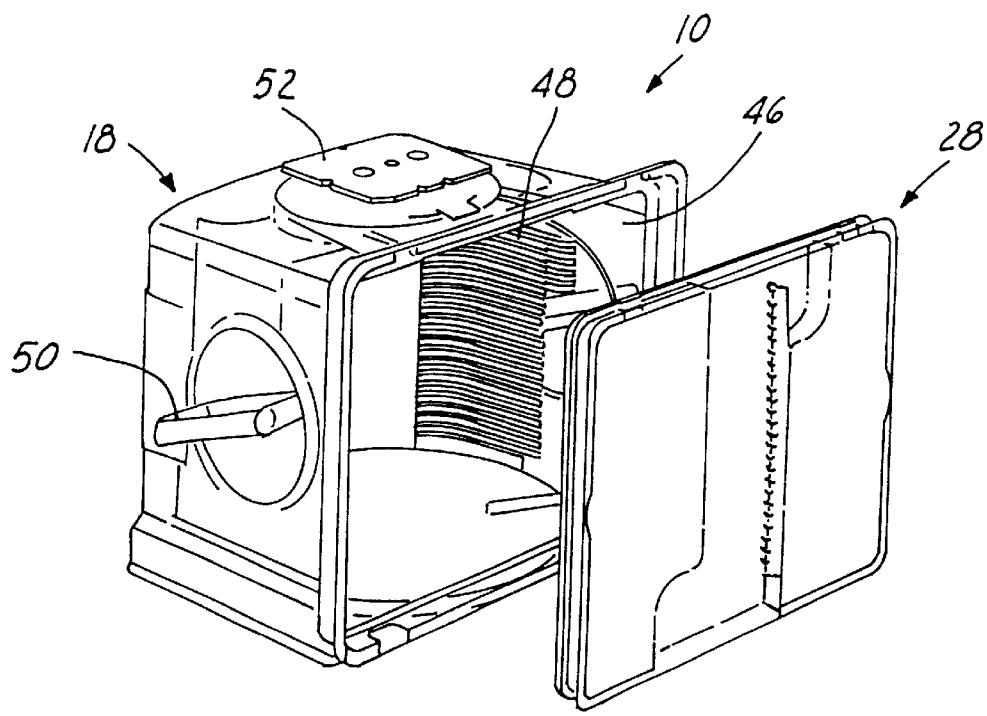
FIG. 2 is a perspective view of a cassette pod for 300 mm wafers and the pod door.
Figure 3:
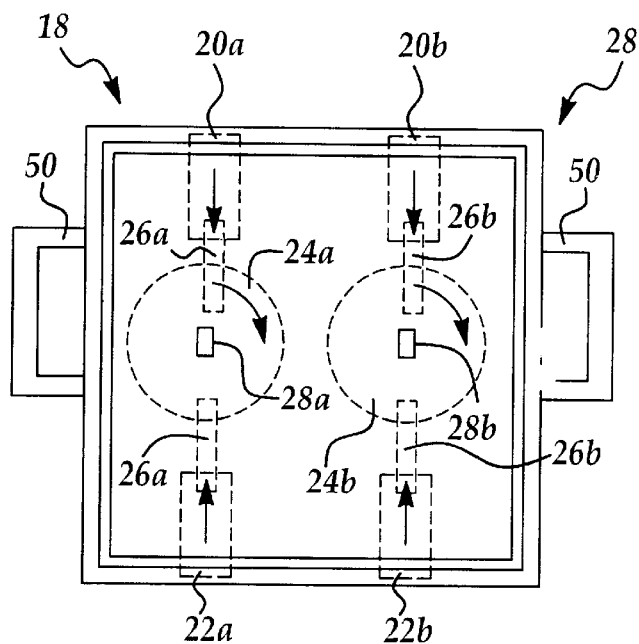
FIG. 3 is a rear view of the cassette pod of FIG. 2 showing the door latch mechanism.
Figure 4:
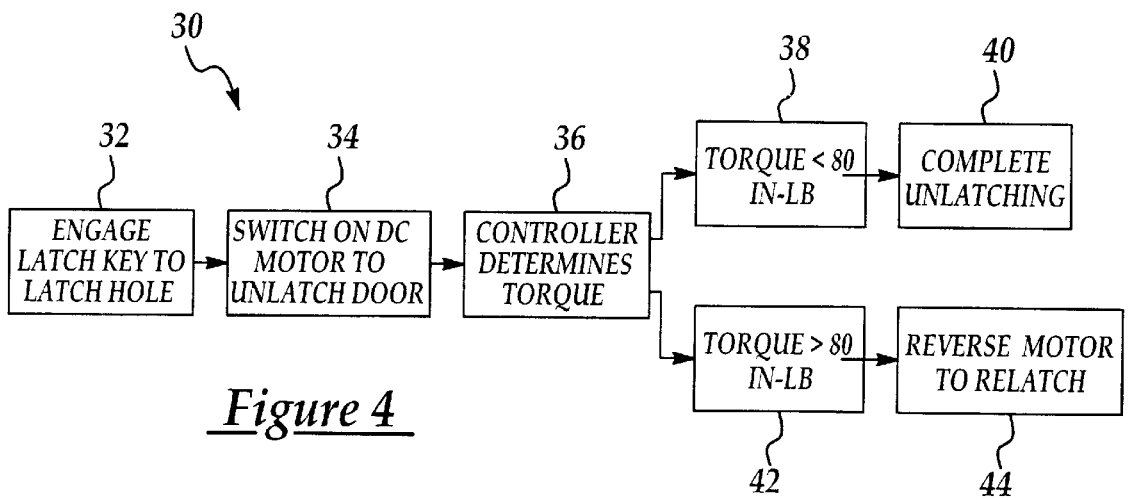
FIG. 4 is a process flow chart for the present invention test method.

Referring initially to FIG. 4, wherein a present invention process flow chart 30 is shown. The present invention test method may be carried out by first engaging latch keys of the door opener in the loadport of a process machine to the latch holes of the cassette pod door. This is shown in FIG. 4 as step 32. After the latch keys are securely engaged inside the latch holes, a DC motor is switched on to a rotational direction to unlatch the cassette pod door, as shown in step 34. An input current to the DC motor is monitored by a controller to determine the torque required for the unlatching operation, as shown in step 36. For instance, an unlatching torque for a 300 mm cassette pod is about 80 in-lb or lower when the cassette pod and the cassette pod door operate properly.

In the next step of the process, as shown in either step 38 or step 42, the unlatching torque determined by the controller is compared to a pre-stored torque value, i.e. 80 in-lb. When the torque value is smaller than 80 in-lb, as shown in step 38, the unlatching operation is completed, as shown in step 40. Alternatively, as shown in step 42, if the unlatching torque determined is larger than 80 in-lb, the DC motor is first stopped and restarted in a rotational direction that is opposite to the previous rotational direction in order to re-latch the cassette pod door onto the cassette pod. This is shown in step 44. This step is important such that a cassette pod is not removed from the loadport of a process machine with the cassette door half-latched and thus, risking accidental opening of the door and severe damage to the wafers stored inside.

Figure 5:
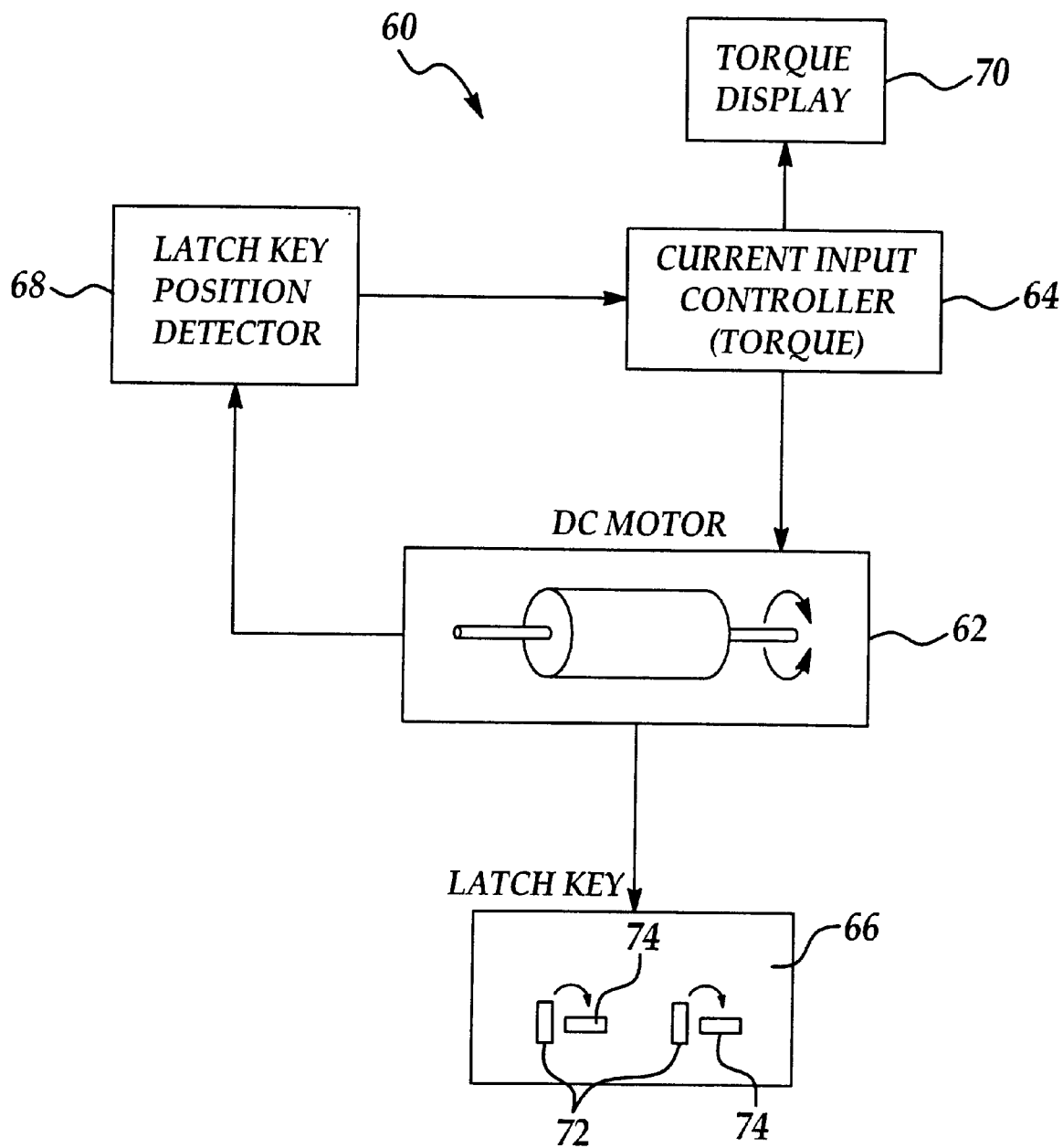
FIG. 5 is an illustration of the present invention test apparatus for detecting the un-latching torque of a cassette pod door.

The present invention apparatus 60 for testing the unlatching torque of a cassette pod door is shown in FIG. 5. It should be noted that the apparatus 60 is shown in a conceptual manner and thus, only the interactions between the various components of the apparatus 60 is shown.

The apparatus 60 consists of a DC motor 62, a controller 64, at least one latch key 66, a latch key position detector 68, and optionally, a torque display device 70. The torque display device 70 is used to display a torque determined by the controller 64 based on the input current to the DC motor 62. It should be noted that the DC motor can be turned either in a clockwise direction or in a counter-clockwise direction to either unlatching the cassette pod door or latching the cassette pod door. The latch keys 66, as shown in FIG. 5, can be turned from a vertical position in an unlatched condition to a horizontal position 74 in a latched condition. The latch key position indicator 68 is monitored to determine whether the latch key has completely turned and thus has unlatched the cassette pod door. When a negative response is received by the controller 64, a failure of unlatching operation is indicated and thus the present invention novel apparatus would reverse the DC motor direction in order to re-latch the cassette pod door onto the cassette pod. It should be noted that the torque value of 80 in-lb generally required for a standard FOUP may be different for other cassette pods.

The present invention novel method and apparatus for testing the unlatching torque of a cassette pod door have therefore been amply described in the above description and in the appended drawings of FIGS. 4 and 5.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for testing the operation of a cassette pod door comprising the steps of:

providing a cassette pod having a door latched on an opening;

engaging a latch key to a latch hole in an exposed surface of said door;

switching on a DC motor to turn said latch key in a first rotational direction for unlatching said door from said cassette pod;

measuring a torque of said DC motor during said switching-on step;

stopping said unlatching operation by switching off said DC motor when said torque measured exceeds 80 in-lb; and switching on said DC motor to turn said latch key in a second rotational direction opposite to said first rotational direction to relatch said door onto said cassette pod.

2. A method for testing the operation of a cassette pod door according to claim 1 further comprising the step of, during said second switching-on step, increasing said torque to larger than 80 in-lb to turn said latch key in said second rotational direction.

3. A method for testing the operation of a cassette pod door according to claim 2 further comprising the step of increasing said torque by increasing a current input to said DC motor.

4. A method for testing the operation of a cassette pod door according to claim 1 further comprising the step of providing a cassette pod for holding 300 mm wafers.

5. A method for testing the operation of a cassette pod door according to claim 1 further comprising the step of providing a controller for controlling the operation of said DC motor.

6. A method for testing the operation of a cassette pod door according to claim 5 further comprising the step of sending an alarm signal to an operator from said controller when a torque larger than 80 in-lb on said DC motor is detected.

7. A method for testing the operation of a cassette pod door according to claim 1 further comprising the step of marking said cassette pod as defective when said torque measured exceeds 80 in-lb.

8. A method for testing the operation of a cassette pod door according to claim 1 further comprising the step of detecting a position of said latch key and determining whether the cassette pod door is completely unlatched.

9. A method for testing the operation of a cassette pod door according to claim 1 further comprising the step of detecting a position of said latch key and sending a signal to a controller to indicate that the cassette pod door is unlatched.

10. An apparatus for testing the unlatching torque of a cassette pod door comprising:

a stage onto which a cassette pod having a door latched thereon is positioned;

a door opening mechanism including latch keys on said stage;

a DC motor for turning said latch keys after engaging latch holes situated in said cassette pod door in either a latching direction or an unlatching direction; and a controller for measuring a torque on said DC motor by monitoring a current input to said DC motor, said controller stops an unlatching position of said latch keys when a torque measured is greater than 80 in-lb and causing said latch keys to turn in an opposite direction to relatch said door onto said cassette pod before said pod is removed from said apparatus.

11. An apparatus for testing the unlatching torque of a cassette pod door according to claim 10 further comprising an alarm for triggering by said controller when said torque of larger than 80 in-lb is detected.

12. An apparatus for testing the unlatching torque of a cassette pod door according to claim 10 further comprising a position detector mounted juxtaposed to said latch hole for determining an unlatched position of said latch keys.

13. An apparatus for testing the unlatching torque of a cassette pod door according to claim 10 further comprising a position detector mounted juxtaposed to said latch hole for sending out a signal indicative of an unlatched position to said controller when such position is detected.

14. An apparatus for testing the unlatching torque of a cassette pod door according to claim 10 further comprising a position detector mounted juxtaposed to said latch Keys for determining an unlatched position of said latch keys.

15. An apparatus for testing the unlatching torque of a cassette pod door according to claim 10 further comprising a position detector mounted juxtaposed to said latch keys for sending out a signal indicative of an unlatched position to said controller.

16. An apparatus for testing the unlatching torque of a cassette pod door according to claim 10, wherein said controller converts an input current to said DC motor to a measurement of torque.

17. An apparatus for testing the unlatching torque of a cassette pod door according to claim 10 further comprising a torque display device for displaying a torque measured by said controller.

* * * * *